United States Patent [19]
Patel

[11] Patent Number: 4,504,948
[45] Date of Patent: Mar. 12, 1985

[54] SYNDROME PROCESSING UNIT FOR MULTIBYTE ERROR CORRECTING SYSTEMS

[75] Inventor: Arvind M. Patel, San Jose, Calif.

[73] Assignee: International Business Machines Corporation, Armonk, N.Y.

[21] Appl. No.: 454,392

[22] Filed: Dec. 29, 1982

[51] Int. Cl.³ .............................................. G06F 11/10
[52] U.S. Cl. ...................................................... 371/38
[58] Field of Search ...................... 371/37, 38; 364/200

[56] References Cited

U.S. PATENT DOCUMENTS

| | | | |
|---|---|---|---|
| 4,388,684 | 6/1983 | Nibby, Jr. et al. | 364/200 |
| 4,413,339 | 11/1983 | Riggle et al. | 371/38 |
| 4,453,251 | 6/1984 | Osman | 371/38 X |
| 4,455,655 | 6/1984 | Galen et al. | 371/38 |

Primary Examiner—Charles E. Atkinson
Attorney, Agent, or Firm—R. E. Cummins; Henry E. Otto, Jr.

[57] ABSTRACT

A syndrome processing unit for a multibyte error correcting system is disclosed in which logical circuitry for performing product operation on selected pairs of 8-bit syndrome bytes and exclusive-OR operations on selected results of the product operations are selectively combined to define usable cofactors that correspond to coefficients of an error locator polynomial corresponding to a selected codeword if the codeword contains less than the maximum number of errors for which the system has been designed.

16 Claims, 3 Drawing Figures

SYNDROME PROCESSING UNIT FOR MULTIBYTE ERROR CORRECTING SYSTEMS

BACKGROUND OF THE INVENTION

1. Field of Invention

This invention relates in general to error correcting systems employing cyclic error correcting codes and, in particular, to an improved method and apparatus for processing syndrome bytes in a multibyte error correcting system.

2. Cross-Referenced Application

Application Ser. No. 454,393, filed concurrently herewith, entitled "On-the-Fly Multibyte Error Correcting System", A. M. Patel, assigned to the assignee of the present invention, discloses a on-the-fly multibyte error correcting system.

3. Description of the Prior Art

The use of cyclic error correcting codes in connection with the storage of data in magnetic storage devices is well established in the prior art and is generally recognized as a very efficient and cost effective addition to the storage system.

Generally, the error correcting process involves the processing of syndrome bytes to determine the location and pattern of each error that is detected. Syndrome bytes result from the exclusive-ORing of ECC write check characters that are generated as data is being written on the storage medium and ECC read check characters that are generated when the data is transferred from or read from storage. The number of ECC check characters employed depends on the desired power of the code and the number of data bytes to be checked or protected. As an example, in many present day ECC systems which are used in connection with the storage of 8-bit bytes in a magnetic storage device, two check bytes are used for each error to be checked in a codeword having a length of 255 byte positions. Thus, for example, six check bytes are required to detect up to three errors in a block of data having 249 data bytes and six check bytes. Thus, six distinctive syndrome bytes are generated in such a system. If there are no errors in the data word comprising the 255 bytes read from storage, then all six syndrome bytes each contain an all zero pattern. Under such a condition, no syndrome processing is required and the data word may be sent to the central processing unit. However, if one or more of the syndrome bytes is non-zero, then syndrome processing involves the process of identifying the location of the bytes in error and further identifying the error pattern for each error location.

The prior art has disclosed in various publications and patents the underlying mathematical concepts and operations which are involved in normal syndrome processing operations. These operations and mathematical explanations generally involve first identifying the location of the errors by use of what has been referred to by Peterson as the "error locator polynomial". The overall objective of the mathematics involved employing the error locator polynomial is to define the locations of the bytes in error by using only the syndrome bytes that are generated in the system.

The prior art has employed the error locator polynomial as the start of the mathematical analysis to express error locations in terms of syndromes so that binary logic may be employed to decode the syndrome bytes into first identifying the locations in error so that subsequent hardware can identify the error patterns in each location. Two problems have existed with the error locator portion of prior art syndrome processing decoders for multi-error correcting systems.

The first problem is that separate sets of logic were required for each of the multi-error conditions. For example, if the system was designed to correct up to three errors, three separate and independent sets of logic were required to identify the error location. That is, the logic required to identify the error locations when there were three errors could not be used to identify the locations if there were less than three errors, i.e., two or a single error. Likewise, the logic designed to identify the error locations if two errors were present could not identify the error location if only one error existed in the codeword. The cost of such prior art decoders was, therefore, quite high.

The second problem with prior art syndrome processing decoders for multibyte error correcting systems is that a division step was required in the mathematical processing of the syndrome bytes to arrive at error locations. It is well recognized that a division operation in higher order binary fields is costly, both in time and hardware implementation.

The present invention provides a decoder for syndrome processing in a multibyte error correcting system which is capable of identifying each error location in a manner which avoids using a division operation and which employs a subset of the hardware used for identifying the maximum number of error locations in the system where the number of errors is less than maximum.

SUMMARY OF THE INVENTION

In accordance with the present invention, a method and apparatus is disclosed in which syndrome bytes are used to develop the appropriate values of the coefficients of the error locator equation $$\sum_{m=0}^{t} \Delta_m \alpha^{mi} = 0 \quad \text{for } i\epsilon\{I\} \tag{1}$$

which, when rewritten for a specific representative case such as a three byte error correction system, takes the following form:

$$\Delta_3\alpha^{3i}+\Delta_2\alpha^{2i}+\Delta_1\alpha^{i}+\Delta_0=0 \text{ for } i\epsilon\{I\} \tag{2}$$

The method involves generating the coefficients by performing product operations and sum operations on the appropriate syndromes in $GF(2^8)$ element algebra to develop a set of location parameters corresponding to the selected determinants in the following matrix equation:

$$\begin{bmatrix} S_0 & S_1 & S_2 \\ S_1 & S_2 & S_3 \\ S_2 & S_3 & S_4 \end{bmatrix} \begin{bmatrix} \sigma_0 \\ \sigma_1 \\ \sigma_2 \end{bmatrix} = \sigma_3 \begin{bmatrix} S_3 \\ S_4 \\ S_5 \end{bmatrix} \tag{3}$$

where the symbols $\sigma_3$, $\sigma_2$, $\sigma_1$ and $\sigma_0$ represent the coefficients of the prior art error locator polynomial.

The expressions for the location parameters are formulated such that cofactors for less than the maximum number of errors are developed in the process of developing the parameters for the maximum number of errors which simplifies the computation and selection of the coefficients of the error locator equation (2). The parameters and the corresponding cofactors for the three error code are developed in accordance with the following four equations:

$$\Delta_{33}=S_2(S_1S_3\oplus S_2S_2)\oplus S_3(S_0S_3\oplus S_1S_2)\oplus S_4(S_1S_1\oplus S_2S_0) \quad (4)$$

$$\Delta_{32}S_3(S_1S_3\oplus S_2S_2)\oplus S_4(S_0S_3\oplus S_1S_2)\oplus S_5(S_1S_1\oplus S_2S_0) \quad (5)$$

$$\Delta_{31}=S_0(S_4S_4\oplus S_3S_5)\oplus S_1(S_3S_4\oplus S_2S_1)\oplus S_2(S_3S_3\oplus S_2S_4) \quad (6)$$

$$\Delta_{30}=S_1(S_4S_4\oplus S_3S_5)\oplus S_2(S_3S_4\oplus S_2S_5)\oplus S_3(S_3S_3\oplus S_2S_4) \quad (7)$$

It is, therefore, an object of the present invention to provide an improved decoder for an error correcting system involving multibyte errors in which only one set of combinatorial logic is employed for identifying the error locations for the various error conditions.

A further object of the present invention is to provide an improved decoder for an error correcting system capable of correcting multiple errors in which coefficients of the error locator polynomial employed to identify error locations is developed without the use of any division operations.

The foregoing and other objects, features and advantages of the invention will be apparent from the following more particular description of a preferred embodiment of the invention as illustrated in the accompanying drawing.

DESCRIPTION OF THE PREFERRED EMBODIMENT

Figure 1:
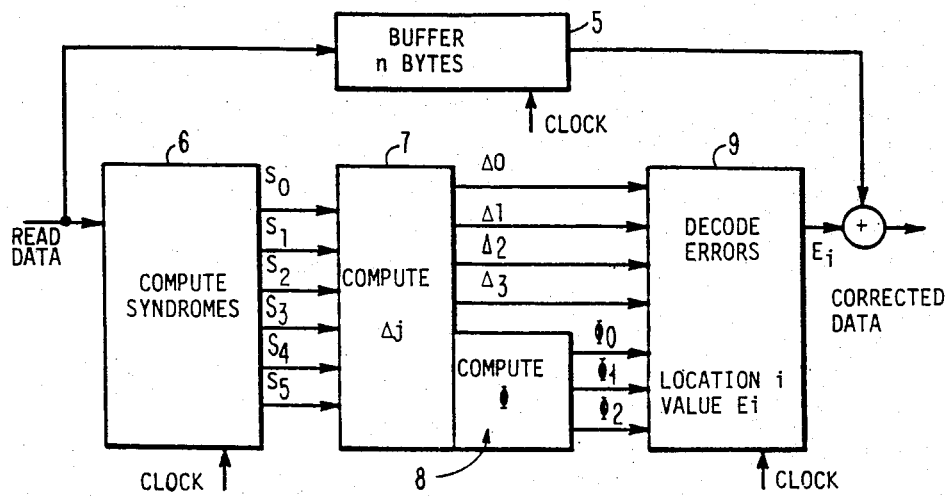
FIG. 1 is a system block diagram of an on-the-fly three-byte error correcting system.

A description of the system shown in FIG. 1 will first be provided. The description of the syndrome processing hardware for identifying error locations and the method of operating the hardware will then be followed by a mathematical explanation and proof of the manner in which the decoder has been implemented. This explanation will disclose in mathematical terms how a decoder can be constructed to operate in an error correcting system for any number of errors.

FIG. 1 shows the block diagram of an on-the-fly decoder which is disclosed and claimed in the copending application Ser. No. 454,393, filed concurrently herewith and assigned to the assignee of the present invention. As described in that application, the decoding process is continuous in an uninterrupted stream of data entering in the form of a chain of n-symbol codewords, hence the name, on-the-fly decoding. From a practical viewpoint, a given decoding process can be considered on-the-fly if it meets the following test, namely, the corrected data bytes of a previously received codeword are delivered to the user system while the data bytes of the following codeword are being received.

The decoder comprising blocks 6, 7, 8, 9 computes syndromes for the incoming codeword as it decodes and corrects errors in the previously received outgoing codeword. Each clock cycle corresponds to an input of one data symbol of the incoming codeword concurrent with an output of one corrected data symbol of the outgoing codeword. A buffer 5 holds at least n-symbols of the uncorrected data in between the incoming and outgoing symbols.

A three-error correcting Reed-Solomon Code in $GF(2^8)$ is used as an example of special interest for applications in computer products. The 256 elements of $GF(2^8)$ are conventionally represented by the set of 8-bit binary vectors. One such representation is given in Table 1. In a three-error correcting Reed-Solomon code, there are six check symbols corresponding to the roots $\alpha^0$, $\alpha^1$, $\alpha^2$, $\alpha^3$, $\alpha^4$, $\alpha^5$ of the generator polynomial where $\alpha$ is an element of a finite field $GF(2^8)$ represented by an 8-bit binary vector.

TABLE 1

| P 110101001 GF256 P | | | | | | | |
|---|---|---|---|---|---|---|---|
| 000 | 00000001 | 051 | 11011100 | 102 | 00101010 | 153 | 11101100 | 204 | 00011011 |
| 001 | 00000010 | 052 | 00010001 | 103 | 01010100 | 154 | 01110001 | 205 | 00110110 |
| 002 | 00000100 | 053 | 00100010 | 104 | 10101000 | 155 | 11100010 | 206 | 01101100 |
| 003 | 00001000 | 054 | 01000100 | 105 | 11111001 | 156 | 01101101 | 207 | 11011000 |
| 004 | 00010000 | 055 | 10001000 | 106 | 01011011 | 157 | 11011010 | 208 | 00011001 |
| 005 | 00100000 | 056 | 10111001 | 107 | 10110110 | 158 | 00011101 | 209 | 00110010 |
| 006 | 01000000 | 057 | 11011011 | 108 | 11000101 | 159 | 00111010 | 210 | 01100100 |
| 007 | 10000000 | 058 | 00011111 | 109 | 00100011 | 160 | 01110100 | 211 | 11001000 |
| 008 | 10101001 | 059 | 00111110 | 110 | 01000110 | 161 | 11101000 | 212 | 00111001 |
| 009 | 11111011 | 060 | 01111100 | 111 | 10001100 | 162 | 01111001 | 213 | 01110010 |
| 010 | 01011111 | 061 | 11111000 | 112 | 10010001 | 163 | 11110010 | 214 | 11100100 |
| 011 | 10111110 | 062 | 01011001 | 113 | 11001011 | 164 | 01001101 | 215 | 01100001 |
| 012 | 11010101 | 063 | 10110010 | 114 | 00111111 | 165 | 10011010 | 216 | 11000010 |
| 013 | 00000011 | 064 | 11001101 | 115 | 01111110 | 166 | 10011101 | 217 | 00101101 |
| 014 | 00000110 | 065 | 00110110 | 116 | 11111100 | 167 | 10010011 | 218 | 01011010 |
| 015 | 00001100 | 066 | 01100110 | 117 | 01010001 | 168 | 10001111 | 219 | 10110100 |
| 016 | 00011000 | 067 | 11001100 | 118 | 10100010 | 169 | 10110111 | 220 | 11000001 |
| 017 | 00110000 | 068 | 00110001 | 119 | 11101101 | 170 | 11000111 | 221 | 00101011 |
| 018 | 01100000 | 069 | 01100010 | 120 | 01110011 | 171 | 00100111 | 222 | 01010110 |
| 019 | 11000000 | 070 | 11000100 | 121 | 11100110 | 172 | 01001110 | 223 | 10101100 |
| 020 | 00101001 | 071 | 00100001 | 122 | 01100101 | 173 | 10011100 | 224 | 11110001 |
| 021 | 01010010 | 072 | 01000010 | 123 | 11001010 | 174 | 10010001 | 225 | 01001011 |
| 022 | 10100100 | 073 | 10000100 | 124 | 00111101 | 175 | 10001011 | 226 | 10010110 |

TABLE 1-continued

```
       P
1 1 0 1 0 1 0 0 1
       GF256 P
```

| | | | | | | | | |
|---|---|---|---|---|---|---|---|---|
| 023 | 11100001 | 074 | 10100001 | 125 | 01111010 | 176 | 10111111 | 227 | 10000101 |
| 024 | 01101011 | 075 | 11101011 | 126 | 11110100 | 177 | 11010111 | 228 | 10100011 |
| 025 | 11010110 | 076 | 01111111 | 127 | 01000001 | 178 | 00000111 | 229 | 11101111 |
| 026 | 00000101 | 077 | 11111110 | 128 | 10000010 | 179 | 00001110 | 230 | 01110111 |
| 027 | 00001010 | 078 | 01010101 | 129 | 10101101 | 180 | 00011100 | 231 | 11101110 |
| 028 | 00010100 | 079 | 10101010 | 130 | 11110011 | 181 | 00111000 | 232 | 01110101 |
| 029 | 00101000 | 080 | 11111101 | 131 | 01001111 | 182 | 01110000 | 233 | 11101010 |
| 030 | 01010000 | 081 | 01010011 | 132 | 10011110 | 183 | 11100000 | 234 | 01111101 |
| 031 | 10100000 | 082 | 10100110 | 133 | 10010101 | 184 | 01101001 | 235 | 11111010 |
| 032 | 11101001 | 083 | 11100101 | 134 | 10000011 | 185 | 11010010 | 236 | 01011101 |
| 033 | 01111011 | 084 | 01100011 | 135 | 10101111 | 186 | 00001101 | 237 | 10111010 |
| 034 | 11110110 | 085 | 11000110 | 136 | 11110111 | 187 | 00011010 | 238 | 11011101 |
| 035 | 01000101 | 086 | 00100101 | 137 | 01000111 | 188 | 00110100 | 239 | 00010011 |
| 036 | 10001010 | 087 | 01001010 | 138 | 10001110 | 189 | 01101000 | 240 | 00100110 |
| 037 | 10111101 | 088 | 10010100 | 139 | 10110101 | 190 | 11010000 | 241 | 01001100 |
| 038 | 11010011 | 089 | 10000001 | 140 | 11000011 | 191 | 00001001 | 242 | 10011000 |
| 039 | 00001111 | 090 | 10101011 | 141 | 00101111 | 192 | 00010010 | 243 | 10011001 |
| 040 | 00011110 | 091 | 11111111 | 142 | 01011110 | 193 | 00100100 | 244 | 10011011 |
| 041 | 00111100 | 092 | 01010111 | 143 | 10111100 | 194 | 01001000 | 245 | 10011111 |
| 042 | 01111000 | 093 | 10101110 | 144 | 11010001 | 195 | 10010000 | 246 | 10010111 |
| 043 | 11110000 | 094 | 11110101 | 145 | 00001011 | 196 | 10001001 | 247 | 10000111 |
| 044 | 01001001 | 095 | 01000011 | 146 | 00010110 | 197 | 10111011 | 248 | 10100111 |
| 045 | 10010010 | 096 | 10000110 | 147 | 00101100 | 198 | 11011111 | 249 | 11100111 |
| 046 | 10001101 | 097 | 10100101 | 148 | 01011000 | 199 | 00010111 | 250 | 01100111 |
| 047 | 10110011 | 098 | 11100011 | 149 | 10110000 | 200 | 00101110 | 251 | 11001110 |
| 048 | 11001111 | 099 | 01101111 | 150 | 11001001 | 201 | 01011100 | 252 | 00110101 |
| 049 | 00110111 | 100 | 11011110 | 151 | 00111011 | 202 | 10111000 | 253 | 01101010 |
| 050 | 01101110 | 101 | 00010101 | 152 | 01110110 | 203 | 11011001 | 254 | 11010100 |

The corresponding syndromes computed by block 6 are denoted by $S_0$, $S_1$, $S_2$, $S_3$, $S_4$, and $S_5$ respectively. These syndromes are computed from the received codeword in the conventional manner in accordance with any known prior art process. The implementation for this step is well known and makes use of exclusive-OR circuits and shift registers. The details of the block 7 logic circuits are shown in FIGS. 2 and 3.

Figure 3:
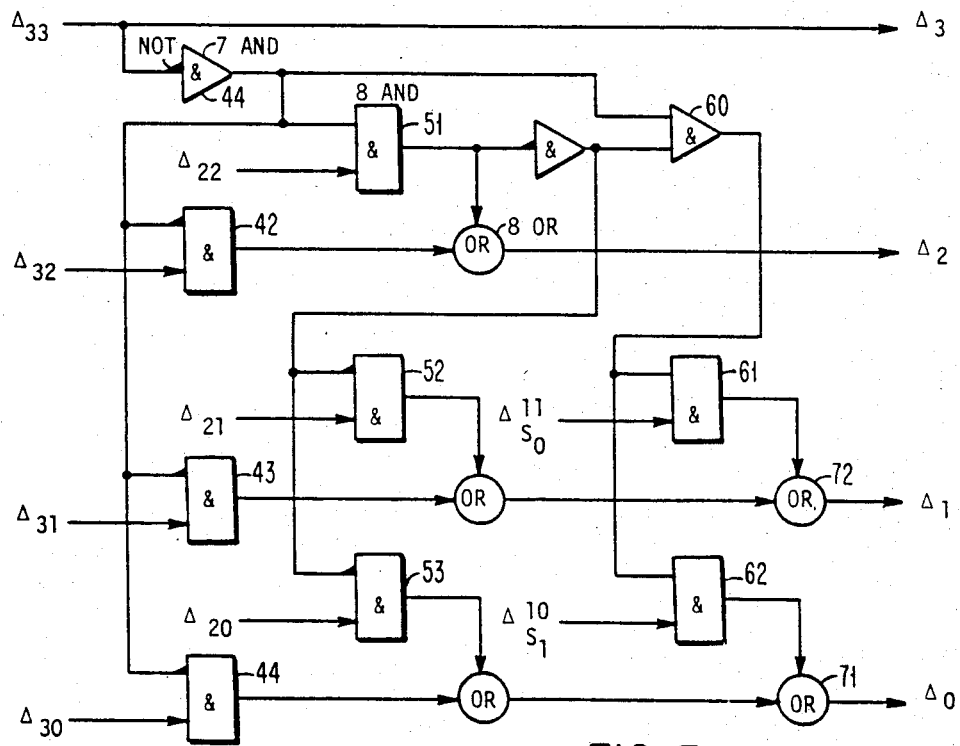
FIG. 3 is a schematic illustration of the combinatorial logic involved obtaining the coefficients $\Delta_m$ in the decoder of FIG. 1 by identifying the exact number of errors and selecting appropriate location parameters when less than three errors are found in the codeword.
Figure 2:
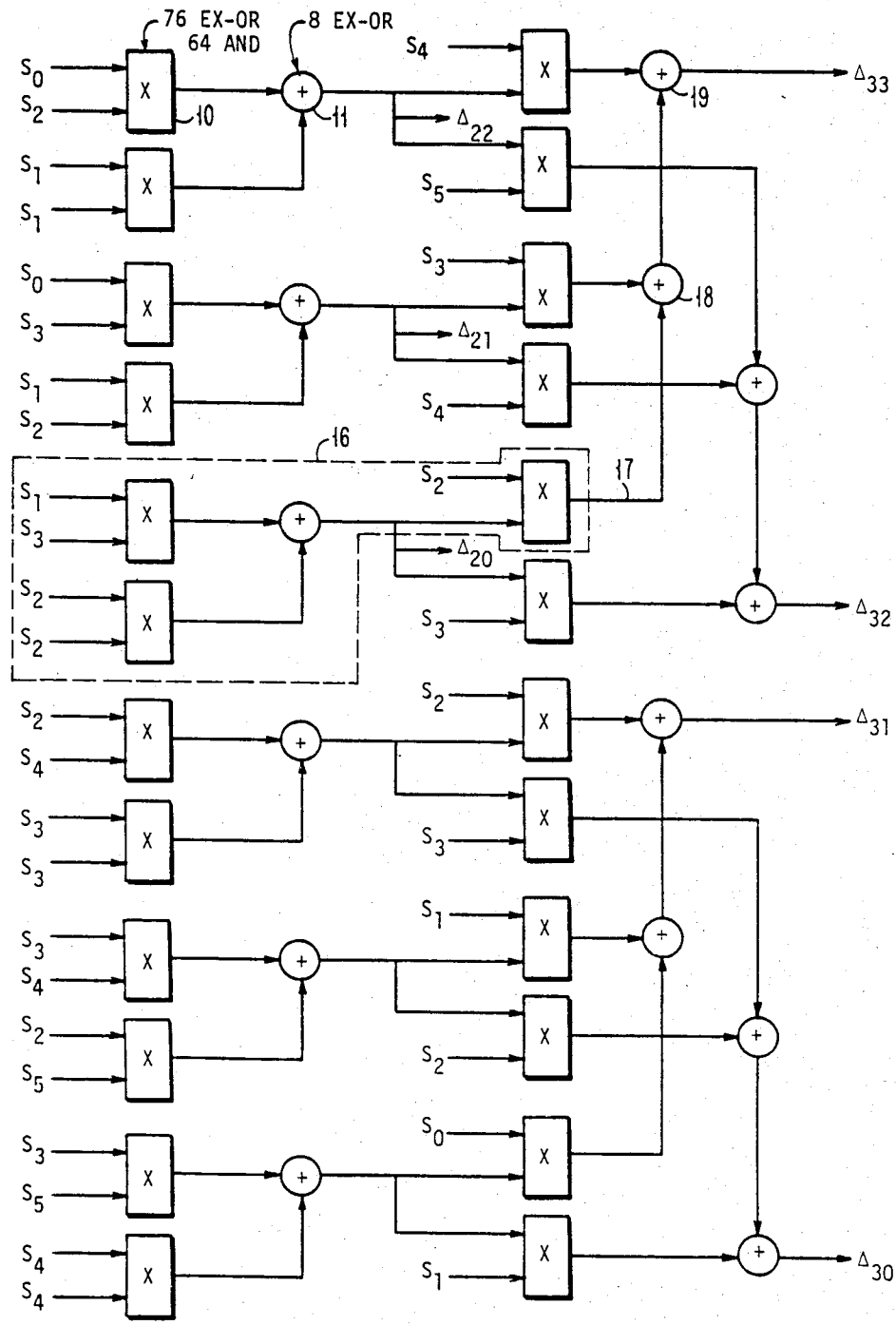
FIG. 2 is a schematic illustration of the combinatorial logic employed in the decoder for the computation of location parameters in the system shown in FIG. 1.

The overall function of the block 7 shown in FIGS. 2 and 3 is first to implement the following four equations to develop the locator parameters $\Delta_{33}$, $\Delta_{32}$, $\Delta_{31}$ and $\Delta_{30}$, which also includes the parameters $\Delta_{22}$, $\Delta_{21}$ and $\Delta_{20}$, and then from these locator parameters, select the coefficients $\Delta_3$, $\Delta_2$, $\Delta_1$ and $\Delta_0$ by the logic shown in FIG. 3 in accordance with the exact number of errors that are involved in the particular codeword. The equations for $\Delta_{33}$, $\Delta_{32}$, $\Delta_{31}$ and $\Delta_{30}$ are as follows:

$$\Delta_{33} = S_2(S_1 S_3 \oplus S_2 S_2) \oplus S_3(S_0 S_3 \oplus S_1 S_2) \oplus S_4(S_1 S_1 \oplus S_2 S_0) \quad (4)$$

$$\Delta_{32} = S_3(S_1 S_3 \oplus S_2 S_2) \oplus S_4(S_0 S_3 \oplus S_1 S_2) \oplus S_5(S_1 S_1 \oplus S_2 S_0) \quad (5)$$

$$\Delta_{31} = S_0(S_4 S_4 \oplus S_3 S_5) \oplus S_1(S_3 S_4 \oplus S_2 S_5) \oplus S_2(S_3 S_3 \oplus S_2 S_4) \quad (6)$$

$$\Delta_{30} = S_1(S_4 S_4 \oplus S_3 S_5) \oplus S_2(S_3 S_4 \oplus S_2 S_5) \oplus S_3(S_3 S_3 \oplus S_2 S_4) \quad (7)$$

These parameters are used to determine the coefficients of the error locator equation (2). The error locations and error patterns can then be determined by the blocks 8 and 9 of the "on-the-fly" system shown in FIG. 1 and described in the cross-referenced application or the errors may be corrected in accordance with other known, more conventional error correcting systems.

The combinatorial logic shown in FIG. 2 includes two basic logic blocks 10 and 11. The first block 10, represented by an X, corresponds to a product operation in GF($2^8$) involving two 8-bit binary vectors, while the second block 11 represents an exclusive-OR binary logical operation. The operation of block 11 is a simple bit-by-bit exclusive-OR logical function using eight 2-way exclusive-OR gates. The product operation, on the other hand, represented by block 10 is more complex and involves 76 exclusive-OR circuits and 64 AND circuits. The need for the 76, XOR circuits and 64 AND circuits may be seen from the following example which explains the product function of block 10.

The product operation of block 10 involves two 8-bit vectors A and B to produce a third vector C where $$A = [a_0, a_1, a_2, a_3, a_4, a_5, a_6, a_7]$$

$$B = [b_0, b_1, b_2, b_3, b_4, b_5, b_6, b_7]$$

$$C = [c_0, c_1, c_2, c_3, c_4, c_5, c_6, c_7]$$

The product is obtained through a two step process. First, compute the coefficients $f_i$ of the product polynomial F where $F = A \times B$, modulo 2. Computation of the coefficients $f_i$ ($i = 0, \ldots 14$) requires 64 AND gates and 49 EX-OR gates:

$$f_0 = a_0 b_0$$
$$f_1 = a_0 b_1 \oplus a_1 b_0$$
$$f_2 = a_0 b_2 \oplus a_1 b_1 \oplus a_2 b_0$$
$$f_3 = a_0 b_3 \oplus a_1 b_2 \oplus a_2 b_1 \oplus a_3 b_0$$
$$\vdots$$
$$f_7 = a_0 b_7 \oplus a_1 b_6 \oplus a_2 b_5 \oplus \ldots \oplus a_6 b_1 \oplus a_7 b_0$$
$$f_8 = a_1 b_7 \oplus a_2 b_6 \oplus a_3 b_5 \oplus \ldots \oplus a_7 b_1$$
$$\vdots$$
$$f_{13} = a_6 b_7 \oplus a_7 b_6$$
$$f_{14} = a_7 b_7$$

Second, reduce the polynomial F, modulo p(x), where p(x) is a primitive binary polynomial of degree 8.

Use $p(x)=1+x^3+x^5+x^7+x^8$. The reduction of $f_i$ modulo $p(x)$ requires at the most 22 EX-OR gates.

$$C_0=f_0 \oplus f_8 \oplus f_9 \oplus f_{10} \oplus f_{12} \oplus f_{13}$$

$$C_1=f_1 \oplus f_9 \oplus f_{10} \oplus f_{11} \oplus f_{13} \oplus f_{14}$$

$$C_2=f_2 \oplus f_{10} \oplus f_{11} \oplus f_{12} \oplus f_{14}$$

$$C_3=f_3 \oplus f_8 \oplus f_9 \oplus f_{10} \oplus f_{11}$$

$$C_4=f_4 \oplus f_9 \oplus f_{10} \oplus f_{11} \oplus f_{12}$$

$$C_5=f_5 \oplus f_8 \oplus f_9 \oplus f_{11}$$

$$C_6=f_6 \oplus f_9 \oplus f_{10} \oplus f_{12}$$

$$C_7=f_7 \oplus f_8 \oplus f_9 \oplus f_{11} \oplus f_{12}$$

The implementation of the product process involves one 2-input AND-gate for each product term required for the coefficient $f_0$ through $f_{14}$ and a 2-input exclusive-OR gate for combining the outputs of the AND-gates. Each block 10, therefore, represents 64 AND-gates, 71 exclusive-OR gates.

The first term of the error locator polynomial $S_2(S_1, S_3 \oplus S_2, S_2)$ of the $\Delta_{33}$ equation is implemented by dashed block 16 in FIG. 2. The output of block 16 is exclusive-ORed in gate 18 with the second term of the equation and the result exclusive-ORed in gate 19 with the last term of the equation.

The blocks involved in developing each of the other determinants $\Delta_{32}$, $\Delta_{31}$ and $\Delta_{30}$ may be traced in a similar manner in FIG. 2.

The parameters $\Delta_{22}$, $\Delta_{21}$ and $\Delta_{20}$ for the two-error case are cofactors in equation (4) for $\Delta_{33}$. These cofactors are:

$$\Delta_{22}=S_1 S_1 \oplus S_2 S_0 \tag{8}$$

$$\Delta_{21}=S_0 S_3 \oplus S_1 S_2 \tag{9}$$

$$\Delta_{20}=S_1 S_3 \oplus S_2 S_2 \tag{10}$$

In FIG. 2, the computations for $\Delta_{22}$, $\Delta_{21}$ and $\Delta_{20}$ are shown as the interim byproducts within the computations for $\Delta_{33}$. Similarly, $\Delta_{11}$ and $\Delta_{10}$ are cofactors in equation (8) for $\Delta_{22}$ which are given by $$\Delta_{11}=S_0 \tag{11}$$

$$\Delta_{10}=S_1 \tag{12}$$

It is shown later in the specification how the equations for developing locator parameters are derived from the following prior art relationship of the error locator polynomial with the syndromes.

$$\begin{bmatrix} S_0 & S_1 & S_2 \\ S_1 & S_2 & S_3 \\ S_2 & S_3 & S_4 \end{bmatrix} \begin{bmatrix} \sigma_0 \\ \sigma_1 \\ \sigma_2 \end{bmatrix} = \sigma_3 \begin{bmatrix} S_3 \\ S_4 \\ S_5 \end{bmatrix} \tag{13}$$

FIG. 3 illustrates the logic for selecting the coefficients of the error locator polynomial from the locator parameters $\Delta_{33}$ through $\Delta_{30}$ and cofactors $\Delta_{22}$ through $\Delta_{10}$. The FIG. 3 logic functions to identify the number of errors from the input parameters $\Delta_{33}$ through $\Delta_{30}$ and cofactors $\Delta_{22}$ through $\Delta_{10}$ and select the appropriate value $\Delta_m$ in the general equation $$\Delta_m = \begin{cases} \Delta_{mm} & \text{for } m > v \\ \Delta_{vm} & \text{for } m \leq v \end{cases} \tag{14}$$

When $\Delta_{33}$ is non-zero, indicating the presence of three errors, the coefficients $\Delta_3$ through $\Delta_0$ will assume the input $\Delta_{33}$ through $\Delta_{30}$. As shown, when $\Delta_{33}$ is non-zero, the output of AND-gate 41 is low, permitting the $\Delta_{32}$, $\Delta_{31}$ and $\Delta_{30}$ to be gated through AND-gates 42, 43 and 44 respectively since the output of AND-gate 41 is inverted at the input to each gate 42-44 to enable each of the above AND-gates.

A similar logic function is achieved by $\Delta_{22}$ if $\Delta_{33}$ is zero indicating not more than two errors are present. In such a situation, $\Delta_2$, $\Delta_1$ and $\Delta_0$ will take the values of $\Delta_{22}$, $\Delta_{21}$ and $\Delta_{20}$ respectively through the operation of AND-gates 51, 52 and 53 respectively. This function corresponds to the syndrome equation for two errors.

The logic circuitry of FIG. 3 functions similarly if $\Delta_{22}$ is also zero to cause $\Delta_1$ and $\Delta_0$ to assume the values of $\Delta_{11}$ and $\Delta_{10}$. AND-gates 61 and 62 gate $\Delta_{11}$ and $\Delta_{10}$ respectively through OR-gates 71, 72 if $\Delta_{33}$ and $\Delta_{22}$ are both zero since AND-gate 60 provides the enabling signal.

The overall logic of FIG. 3, therefore, functions to produce or to select the correct values of the coefficients $\Delta_3$, $\Delta_2$, $\Delta_1$ and $\Delta_0$ for the error locator equations from the locator parameters developed by the logic of FIG. 2.

Although the above is described for a special case of three-error correcting Reed-Solomon code, the decoder for any multiple error correcting cyclic codes, such as BCH codes, can be implemented in accordance with the above teachings.

The following is the mathematical derivation for the equations used in the logic implementation of FIGS. 2 and 3.

In the three-error correcting Reed-Solomon Code in $GF(2^8)$ there are six check symbols corresponding to the roots $\alpha^0$, $\alpha^1$, $\alpha^2$, $\alpha^3$, $\alpha^4$, $\alpha^5$ of the generator polynomial. The corresponding syndromes are denoted by $S_0$, $S_1$, $S_2$, $S_3$, $S_4$ and $S_5$ respectively.

We assume that, at the most, three symbols are in error. The error values are denoted by $E_{i1}$, $E_{i2}$ and $E_{i3}$ and the locations of erroneous symbols are denoted by $i_1$, $i_2$ and $i_3$. Then the relationships between the syndromes and the errors are given by $$S_j = \alpha^{j i_1} E_{i1} \oplus \alpha^{j i_2} E_{i2} \oplus \alpha^{j i_3} E_{i3} \text{ for } j = 0, 1, 2, 3, 4, 5. \tag{1A}$$

Consider the polynomial with roots at $\alpha^{i1}$, $\alpha^{i2}$ and $\alpha^{i3}$. This is called error locator polynomial, given by $$(x \oplus \alpha^{i1})(x \oplus \alpha^{i2})(x \oplus \alpha^{i3}) = x^3 \oplus \sigma_2 x^2 \oplus \sigma_1 x \oplus \sigma_0 \tag{2A}$$

Substituting $x = \alpha^i$ in (2A) we get $$\alpha^{3i} \oplus \sigma_2 \alpha^{2i} \oplus \sigma_1 \alpha^i \oplus \sigma_0 = 0 \text{ for } i = i_1, i_2 \text{ and } i_3. \tag{3A}$$

From equations (1A) and (3A), we can derive the following relationship between the syndromes $S_j$ and the coefficients $\sigma_i$ of the error location polynomial.

$$\begin{bmatrix} S_0 & S_1 & S_2 \\ S_1 & S_2 & S_3 \\ S_2 & S_3 & S_4 \end{bmatrix} \begin{bmatrix} \sigma_0 \\ \sigma_1 \\ \sigma_2 \end{bmatrix} = \begin{bmatrix} S_3 \\ S_4 \\ S_5 \end{bmatrix} \quad (4A)$$

We can solve Equation (4A) and obtain $\sigma_0$, $\sigma_1$ and $\sigma_2$ as $$\sigma_0 = \frac{\Delta_{30}}{\Delta_{33}}, \sigma_1 = \frac{\Delta_{31}}{\Delta_{33}} \text{ and } \sigma_2 = \frac{\Delta_{32}}{\Delta_{33}} \quad (5A)$$

where $\Delta_{33}$, $\Delta_{32}$, $\Delta_{31}$ and $\Delta_{30}$ are given by $$\Delta_{33} = S_2(S_1 S_3 \oplus S_2 S_2) \oplus S_3(S_0 S_3 \oplus S_1 S_2) \oplus S_4(S_1 S_1 \oplus S_2 S_0) \quad (6A)$$

$$\Delta_{32} = S_3(S_1 S_3 \oplus S_2 S_2) \oplus S_4(S_0 S_3 \oplus S_1 S_2) \oplus S_5(S_1 S_1 \oplus S_2 S_0) \quad (7A)$$

$$\Delta_{31} = S_0(S_4 S_4 \oplus S_3 S_5) \oplus S_1(S_3 S_4 \oplus S_2 S_5) \oplus S_2(S_3 S_3 \oplus S_2 S_4) \quad (8A)$$

$$\Delta_{30} = S_1(S_4 S_4 \oplus S_3 S_5) \oplus S_2(S_3 S_4 \oplus S_2 S_5) \oplus S_3(S_3 S_3 \oplus S_2 S_4) \quad (9A)$$

If the value of $\Delta_{33}$ is 0, then Equation (4A) is a dependent set which implies that there are fewer than three errors. In that case, the syndromes will be processed for two errors where the parameters $\Delta_{22}$, $\Delta_{21}$ and $\Delta_{20}$ are derived from similar equations for the case of two errors and are given by $$\Delta_{22} = S_1 S_1 \oplus S_2 S_0 \quad (10A)$$

$$\Delta_{21} = S_0 S_3 \oplus S_1 S_2 \quad (11A)$$
$$\Delta_{20} = S_1 S_3 \oplus S_2 S_2 \quad (12A)$$

Note that these are cofactors of $\Delta_{33}$ as seen from Equation (6A) which can be rewritten as $$\Delta_{33} = S_2 \Delta_{20} \oplus S_3 \Delta_{21} \oplus S_4 \Delta_{22} \quad (13A)$$

Thus, the values $\Delta_{22}$, $\Delta_{21}$ and $\Delta_{20}$ for the case of two errors need not be computed separately. They are available as byproducts of the computation for $\Delta_{33}$. Similarly, $\Delta_{11}$ and $\Delta_{10}$ for the case of one error are given by $$\Delta_{11} = S_0 \quad (14A)$$

$$\Delta_{10} = S_1 \quad (15A)$$

which are cofactors of $\Delta_{22}$ and are also readily available as syndromes.

Let $v$ denote the exact number of errors, which may be 3, 2, 1 or 0.

The exact number of errors is determined as follows:

$v=3$ if $\Delta_{33} \neq 0$
$v=2$ if $\Delta_{33}=0$ and $\Delta_{22} \neq 0$
$v=1$ if $\Delta_{33}=\Delta_{22}=0$ and $\Delta_{11} \neq 0$
$v=0$ if $\Delta_{33}=66_{22}=66_{11}=0$ \quad (16A)

The special cases of two and one errors can be accomodated automatically by selecting appropriate determinants. To this end, let $\Delta_3$, $\Delta_2$, $\Delta_1$ and $\Delta_0$ be defined as $$\Delta_3 = \Delta_{33} \quad (17A)$$

$$\Delta_2 = \Delta_{32} \text{ if } v = 3 \quad (18A)$$

$\Delta_{22}$ if $v = 2$ $\Delta_1 = \Delta_{31}$ if $v = 3$ \quad (19A)

$\Delta_{21}$ if $v = 2$ $\Delta_{11}$ if $v = 1$ $\Delta_0 = \Delta_{30}$ if $v = 3$ \quad (20A)

$\Delta_{20}$ if $v = 2$ $\Delta_{10}$ if $v = 1$

Then equation (5A) can be rewritten as $$\sigma_0 = \frac{\Delta_0}{\Delta_v}, \sigma_1 = \frac{\Delta_1}{\Delta_v} \text{ and } \sigma_2 = \frac{\Delta_2}{\Delta_v} \quad (21A)$$

Conventionally, the error locator polynomial (3A) with the coefficients $\tau_0$, $\tau_1$ and $\tau_2$ of equation (21A) is used to determine error locations through the well known Chien search procedure. However, the error locator equation can be modified in order to avoid the division by $\Delta_v$. The modified error locator equation is given as $$\Delta_3 \alpha^{3i} + \Delta_2 \alpha^{2i} + \Delta_1 \alpha^i + \Delta_0 = 0 \quad (22A)$$

The error location numbers are the set of $v$ unique values of $i$ which satisfy Equation (22A).

The General Case of t Errors

The following is the mathematical derivation for the general case to establish that the logic set forth in FIGS. 2 and 3 for the special case of up to three errors is applicable in general for t errors.

In a general BCH or Reed-Solomon code, the codeword consists of n-symbols which include r check symbols corresponding to the roots $\alpha^a, \alpha^{1+1}, \alpha^{a+2}, \ldots, \alpha^{a+r-1}$ of the generator polynomial where $\alpha$ is an element of the Galois field GF(256). The integer a will be taken to be zero, although all of the following results can be derived with any value of a. The corresponding syndromes are denoted by $S_0, S_1, S_2, \ldots, S_{r-1}$ respectively. The syndromes can be computed from the received codeword as $$S_j = \sum_{i=0}^{n-1} \alpha^{ji} B_i \quad j = 0, 1, 2, \ldots, (r-1) \quad (1B)$$

where $B_0, B_1, B_2, \ldots, B_{n-1}$ are the n-symbols of the received codeword.

Let $v$ denote the actual number of symbols in error in a given codeword. The error values are denoted by $E_i$ where i represents an error location value from a set of $v$ different error locations given by $\{I\}=\{i_1, i_2, \ldots, i_v\}$. The relationship between syndromes and the errors are then given by $$S_j = \sum_{i \in \{I\}} \alpha^{ji} E_i \quad j = 0, 1, 2, \ldots, (r-1) \quad (2B)$$

Any non-zero value of a syndrome indicates the presence of errors. The decoder processes these syndromes in order to determine the locations and values of the errors. Let t denote the maximum number of errors that can be decoded without ambiguity. A set of $r=2t$ syndromes are required to determine the locations and values of t errors.

Consider the polynomial with roots at $\alpha^i$ where $i\epsilon\{I\}$. This is called the error locator polynomial defined as $$\prod_{i\epsilon\{I\}}(1 - \alpha^{-i}x) = \sum_{m=0}^{v}\sigma_m x^m = \sum_{m=0}^{t}\sigma_m x^m \quad (3B)$$

where $\tau_0=1$, $\tau_v\neq 0$ and for $m>v$, $\tau_m=0$. The unknown coefficients $\tau_m$ for $m\leq v$ can be determined from the syndromes of Equation 1B as shown below.

Substituting $x=\alpha^i$ in Equation 3B we get $$\sum_{m=0}^{t}\sigma_m\alpha^{mi} = 0 \quad \text{for } i\epsilon\{I\}. \quad (4B)$$

Using Equations 2B and 4B, it is easy to show that the syndromes $S_j$ and the coefficients $\tau_m$ of the error locator polynomial satisfies the following set of relationships:

$$\sum_{m=0}^{t}\sigma_m S_{m+k} = 0 \quad \text{for } k = 0, 1, \ldots, t-1 \quad (5B)$$

The set of equations 5B can be rewritten in matrix notation as $$\begin{bmatrix} S_0 & S_1 & \ldots & S_t \\ S_1 & S_2 & \ldots & S_{t+1} \\ \vdots & \vdots & & \vdots \\ S_{t-1} & S_t & \ldots & S_{2t-1} \end{bmatrix} \begin{bmatrix} \sigma_0 \\ \sigma_1 \\ \vdots \\ \sigma_{t-1} \\ \sigma_t \end{bmatrix} = 0 \quad (6B)$$

Let M denote the $t\times(t+1)$ syndrome matrix on left side of Equation 6B. Let $M_t$ denote the square matrix obtained by eliminating the last column in matrix M. If $M_t$ is nonsingular, then the above set of equations can be solved using Cramer's rule to obtain $$\frac{\sigma_m}{\sigma_t} = \frac{\Delta_{tm}}{\Delta_{tt}} \quad \text{for } m = 0, 1, \ldots t-1 \quad (7B)$$

where $\Delta_{tt}$ is the non-zero determinant of matrix $M_t$ and $\Delta_{tm}$ denotes the determinant of the matrix obtained by replacing the $m^{th}$ column in matrix $M_t$ by negative of the last column of the syndrome matrix M for each $m=0, 1, \ldots, t-1$.

If matrix $M_t$ is singular, (i.e., $\Delta_{tt}$ is 0) then Equation 5B is a dependent set which implies that there are fewer than t errors. In that case, $\tau_t$ is 0. We can delete $\tau_t$ and last row and last column of the syndrome matrix in 6B. The resulting matrix equation corresponds to that for $t-1$ errors. This process is repeated if necessary so that the final matrix equation corresponds to that for v errors and M is nonsingular. Then we need the set of determinants $\Delta_{vm}$ where $M=0, 1, \ldots, v$.

It can be easily seen that $\Delta_{vm}$ for $v=t-1$ is a cofactor of $\Delta_{tt}$ corresponding to the $(m-1)^{st}$ column and $t^{th}$ row in matrix $M_t$. We can express $\Delta_{tt}$ in terms of these cofactors:

$$\Delta_{tt} = \sum_{m=0}^{t-1} S_{t-1+m}\Delta_{(t-1)m} \quad (8B)$$

Thus the values $\Delta_{vm}$ for $v=t-1$ need not require separate computations. They are available as byproduct of the computation for $\Delta_{tt}$. In fact, $\Delta_{vm}$ for subsequent smaller values of v are all available as byproducts of the computation for $\Delta_{tt}$ through the hierarchical relationships of lower order cofactors. Thus, in case of fewer errors, the decoder finds $\Delta_{tt}=0$ and automatically back tracks into prior computations to the correct value for v and uses the already computed cofactors $\Delta_{vm}$. This is illustrated previously through hardware implmentation of the case $t=3$.

In order to accomodate the special cases of all fewer errors, we will replace Equation 7B by a more convenient general form $$\frac{\sigma_m}{\sigma_v} = \frac{\Delta_m}{\Delta_v} \quad \text{for } m = 0, 1, 2, \ldots, t \quad (9B)$$

where v is determined from the fact that $\Delta_{mm}=0$ for all $m>v$ and $\Delta_{vv}\neq 0$; and $\Delta_m$ is defined with the new notation as $$\Delta_m = \begin{cases} \Delta_{mm} & \text{for } m > v \\ \Delta_{vm} & \text{for } m \leq v \end{cases} \quad (10B)$$

Since $\tau_0=1$, one can determine $\tau_m$ for all values of m using Equation (9). However, we will see that the coefficients $\tau_m$ are not needed in the entire decoding process. To this end, we obtain a modified error locator equation from Equations (4) and (9) as given by $$\sum_{m=0}^{t}\Delta_m\alpha^{mi} = 0 \quad \text{for } i\epsilon\{I\} \quad (11B)$$

The error location values $i\epsilon\{I\}$ are the set of v unique values of i which satisfy Equation (11B).

While the invention has been particularly shown and described with reference to a preferred embodiment thereof, it will be understood by those skilled in the art that various other changes in the form and details may be made therein without departing from the spirit and scope of the invention.

Having thus described my invention, what I claim as new and desire to secure by Letters Patent is:

1. In an apparatus for processing syndrome bytes in a multibyte error correcting system of the type wherein each character is represented by a byte consisting of a unique combination of "b" binary bits, and write check bytes are generated as data is being written on a storage medium, and read check bytes are generated when the data is read from the storage medium, and the apparatus is operable to correct up to t errors in a selected codeword containing up to $2^b$ character positions by processing 2t syndrome bytes, each containing "b" bits which were generated by combining write check bytes and read check bytes that correspond to the modulo 2 sum of bit positions of said codeword that were selected systematically in accordance with a parity check matrix reflecting the roots $\alpha^a$, $\alpha^{a+1}$, $\alpha^{a+2}$, ..., $\alpha^{a+2t-1}$ of a generator polynomial where $\alpha$ is an element of the finite field of $2^b$ elements, the combination comprising:

(1) syndrome generating means for generating 2t syndrome bytes from said selected codeword as it is read from the storage medium; and (2) circuit means responsive to said 2t syndrome bytes for developing t+1 coefficients $\Delta$ for an error locator polynomial corresponding to said selected codeword, said circuit means being characterized by logic means responsive to predetermined combinations of said syndrome bytes to produce cofactors corresponding to coefficients Δ of the error locator polynomial when less than t errors occur, and combining circuitry for selectively combining said cofactor signal when t errors occur.

2. The combination recited in claim 1 in which said logic means for producing said cofactors comprises a plurality of product blocks each of which is operable to multiply two "b" bit vector input signals to provide a product output signal.

3. The combination recited in claim 2 in which said logic means further includes means comprising a plurality of exclusive-OR gates for combining selected said product output signals to produce said cofactors.

4. The combination recited in claim 2 including means for connecting the output of said syndrome generating means to selected said product blocks.

5. The combination recited in claim 3 in which said combining means comprises another plurality of said product blocks and means for supplying selected said cofactors and selected said syndromes to said another plurality of said product blocks to provide a second set of product output signals.

6. The combination recited in claim 5 including another plurality of exlusive-OR gates for combining selected ones of said second set of product output signals to produce a set of t+1 error parameter signals.

7. The combination recited in claim 6 further including logic means for selecting either said t+1 error parameter signals for said error coefficients or said cofactors for said coefficients in accordance with the number of errors in said codeword.

8. The combination recited in claim 1 in which "b" is 8.

9. The combination recited in claim 1 in which said circuit means is implemented in integrated circuit technology to correct t errors employing 2t syndrome bytes.

10. The combination recited in claim 1 in which said syndrome generating means generates $2(t-x)$ syndrome bytes and said circuit means corrects up to $(t-x)$ errors.

11. A method for processing syndrome bytes in a multibyte error correcting system operable to detect up to t errors in a selected codeword containing up to $2^b$ character positions, where each character is represented by a byte consisting of a unique combination of "b" binary bits, by processing 2t syndrome bytes, each containing "b" bits which were generated by combining write check bytes and read check bytes generated respectively when data is written into and read from a storage medium, said check bytes corresponding to the modulo 2 sum of bit positions of said codeword that were selected systematically in accordance with a parity check matrix reflecting the roots $\alpha^a$, $\alpha^{a+1}$, $\alpha^{a+2}$, . . . , $\alpha^{a+2t-1}$ of a generator polynomial where $\alpha$ is an element of the finite field of $2^b$ elements, the method comprising the steps of:

(1) generating 2t syndrome bytes by reading said selected codeword; and (2) developing t+1 coefficients Δ for an error locator polynomial corresponding to said selected codeword by logically combining predetermined combinations of said syndrome bytes to produce cofactors corresponding to coefficients Δ of the error locator polynomial when less than t errors occur, and selectively combining said cofactor bytes with selected syndromes when t errors occur to provide said t+1 coefficients.

12. The method recited in claim 11 in which said step of developing includes multiplying pairs of selected syndromes as "b" bit vectors to produce a plurality of product output signals and exclusive-ORing selected pairs of said product output signals to produce said cofactors.

13. The method recited in claim 12 further including multiplying each said cofactor with a different preselected syndrome byte as "b" bit vectors to produce a second set of product output signals and exlusive-ORing selected pairs of said second plurality of product output signals to provide error parameter signals corresponding to said coefficients when t errors are present.

14. The method recited in claim 13 further including the step of examining a selected error parameter signal to determine if t errors has occurred in said codeword.

15. The method recited in claim 14 in which a cofactor signal is also examined if less than t errors has occurred.

16. Circuit means for processing syndromes from a multibytes error correcting system operable to correct up to t errors in a selected codeword containing up to $2^b$ character positions, where each character is represented by a byte consisting of a unique combination of "b" binary bits, by processing 2t syndrome bytes, each containing "b" bits which were generated by combining write check bytes and read check bytes generated respectively during writing of data onto and reading of data from a storage medium, and which check bytes correspond to the modulo 2 sum of bit positions of said codeword that were selected systematically in accordance with a parity check matrix reflecting the roots $\alpha^a$, $\alpha^{a+1}$, $\alpha^{a+2}$, . . . , $\alpha^{a+2t-1}$ of a generator polynomial where $\alpha$ is an element of the finite field of $2^b$ elements, said circuit means responsive to said 2t syndrome bytes for developing t+1 coefficients Δ for a error locator polynomial corresponding to the selected codeword, said circuit means being characterized by logic means responsive to predetermined combinations of said syndrome bytes to produce cofactors corresponding to coefficients Δ of the error locator polynomial when less than t errors occur, and combining circuitry for selectively combining said cofactor signals when all t errors occur to produce said t+1 coefficients.

* * * * *

UNITED STATES PATENT AND TRADEMARK OFFICE
CERTIFICATE OF CORRECTION

PATENT NO. : 4,504,948
DATED : March 12, 1985
INVENTOR(S) : Arvind M. Patel

It is certified that error appears in the above—identified patent and that said Letters Patent is hereby corrected as shown below:

Column 8, line 19, "1the" should be --the--.

Column 9, line 58, equation (16A) line 4, "v = 0 if $\Delta_{33}$ = $66_{22}$ = $66_{11}$ = 0" should be --v = 0 if $\Delta_{33}$ = $\Delta_{22}$ = $\Delta_{11}$ = 0--.

Column 10, line 20, "$\tau_0$, $\tau_1$ and $\tau_2$" should be --$\sigma_0$, $\sigma_1$ and $\sigma_2$--.

Column 10, line 37, "$\alpha^{1+1}$" should be --$\alpha^{a+1}$--.

Column 10, line 48, equation (1B) "$B_i$" should be --$\hat{B}_i$--.

Column 10, line 50, "$B_0$, $B_1$, $B_2$, . . . , $B_{n-1}$" should be --$\hat{B}_0$, $\hat{B}_1$, $\hat{B}_2$, . . . , $\hat{B}_{n-1}$--.

Column 11, line 7, "$\tau_0$" should be --$\sigma_0$--, "$\tau_v$" should be --$\sigma_v$--, and "$\tau_m$" should be --$\sigma_m$--

UNITED STATES PATENT AND TRADEMARK OFFICE
CERTIFICATE OF CORRECTION

PATENT NO. : 4,504,948

DATED : March 12, 1985

INVENTOR(S) : Arvind M. Patel

It is certified that error appears in the above—identified patent and that said Letters Patent is hereby corrected as shown below:

Column 11, line 8, "$\tau_m$" should be -- $\sigma_m$ --.

Column 11, line 16, "$\tau_m$" should be -- $\sigma_m$ --.

Column 11, line 50, both "$\tau_t$" should be -- $\sigma_t$ --.

Column 12, line 24, "$\tau_0$" should be -- $\sigma_0$ -- and "$\tau_m$" should be -- $\sigma_m$ --.

Column 12, line 26, "$\tau_m$" should be -- $\sigma_m$ --.

Signed and Sealed this

Nineteenth Day of November 1985

[SEAL]

Attest:

DONALD J. QUIGG

Attesting Officer

Commissioner of Patents and Trademarks